(12) United States Patent
Shimizu et al.

(10) Patent No.: US 6,999,299 B2
(45) Date of Patent: Feb. 14, 2006

(54) CAPACITOR STRUCTURE, A MULTI-LAYER WIRING BOARD INCLUDING THE SAME, AND A SEMICONDUCTOR DEVICE USING THE MULTI-LAYER WIRING BOARD

(75) Inventors: Noriyoshi Shimizu, Nagano (JP); Tomoo Yamasaki, Nagano (JP); Kiyoshi Ooi, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/918,746

(22) Filed: Aug. 16, 2004

(65) Prior Publication Data

US 2005/0052822 A1   Mar. 10, 2005

(30) Foreign Application Priority Data

Aug. 26, 2003   (JP)   ............................. 2003-300973

(51) Int. Cl.
*H01G 4/228*   (2006.01)
*H01G 4/236*   (2006.01)
*H01G 4/005*   (2006.01)

(52) U.S. Cl. ..................... 361/306.2; 361/307; 361/303
(58) Field of Classification Search ................ 361/307, 361/306.2, 306.3, 301.2, 306.1, 328, 330, 361/761, 763
See application file for complete search history.

(56) References Cited

U.S. PATENT DOCUMENTS

| | | | | |
|---|---|---|---|---|
| 5,172,304 | A | * | 12/1992 | Ozawa et al. ................ 361/763 |
| 6,351,369 | B1 | * | 2/2002 | Kuroda et al. ........... 361/306.3 |
| 6,370,011 | B1 | * | 4/2002 | Naito et al. .............. 361/306.1 |
| 6,407,907 | B1 | * | 6/2002 | Ahiko et al. ............. 361/306.3 |
| 6,606,237 | B1 | * | 8/2003 | Naito et al. .............. 361/306.3 |
| 6,764,931 | B1 | | 7/2004 | Iijima et al. |

FOREIGN PATENT DOCUMENTS

JP   11-68319   3/1999

* cited by examiner

*Primary Examiner*—Eric W. Thomas
(74) *Attorney, Agent, or Firm*—Armstrong, Kratz, Quintos, Hanson & Brooks, LLP

(57) ABSTRACT

A capacitor structure includes a first electrode provided on an insulating basic member, a dielectric member provided on the electrode, a second electrode provided on the dielectric member, and a plurality of electrode terminals aligned in a grid on the electrode. Respective electrode terminals are aligned such that opposite polarities (+,–) are alternately allocated to neighboring electrode terminals, and respective divided partial electrodes of the first and second electrodes are also aligned such that opposite polarities (+,–) are alternately allocated to neighboring electrode terminals. According to this structure, the inductance of the capacitor structure is reduced and thus the decoupling effect can be effectively achieved. This contributes to a stable operation in the high-frequency (GHz band) range.

6 Claims, 8 Drawing Sheets

A1 : CHARACTERISTICS OF ELECTRODE WITH LARGER AREA
A2 : CHARACTERISTICS OF ELECTRODE WITH SMALLER AREA
A : SYNTHESIZED CHARACTERISTICS

CAPACITOR STRUCTURE, A MULTI-LAYER WIRING BOARD INCLUDING THE SAME, AND A SEMICONDUCTOR DEVICE USING THE MULTI-LAYER WIRING BOARD

BACKGROUND OF THE INVENTION (a) Field of the Invention

The present invention relates to a capacitor structure, more particularly, to a decoupling capacitor (structure) packaged into a multi-layer wiring board mounting thereon a semiconductor element (chip) or electronic parts, requiring a high-speed switching operation, and to a multi-layer wiring board and a semiconductor device into which the capacitor is built respectively.

Here the multi-layer wiring board functions as a package on which the semiconductor element (chip), and the like, are mounted, and thus is also referred to as a "semiconductor package" in the description below, for convenience of explanation.

(b) Description of the Related Art

In the recent semiconductor packages (multi-layer wiring boards) in which a higher density is required, respective wiring patterns are arranged very close to each other. Therefore, such problems may arise that crosstalk noises are generated between wirings, or that potentials of the power supply line, and the like, are varied. In particular, in the package on which a semiconductor element or electronic parts requiring a high-speed switching operation are mounted, the crosstalk noise is easy to happen with an increase in the frequency, and the switching noise also happens because the switching element is turned ON/OFF at high speed. As a result, potentials of the power supply line, and the like, are liable to vary.

Therefore, in the prior art, for the purpose of stabilizing the power supply voltage and reducing the switching noise, or the like, the power supply line, the signal line, or the like, is "decoupled" by attaching a capacitive element such as a chip capacitor or the like, to the package on which semiconductor elements are mounted.

In this case, the margin in design of the wiring patterns is restricted because of the provision of the chip capacitor, otherwise leading distances of the wiring patterns to connect the chip capacitor and power supply/ground terminals of the semiconductor element are lengthened to thereby cause an increase in the inductance. If the inductance is high, the decoupling effect by the capacitor is weakened. Thus, it is desirable that the inductance should be as small as possible. In other words, it is desirable that a capacitive element such as a chip capacitor or the like, should be arranged as close as possible to the semiconductor element.

To cope with this, it may be conceived that, in place of attaching the capacitive element such as the chip capacitor or the like, to the semiconductor package, the equivalent capacitive element (capacitor) is incorporated into the semiconductor package. An example of the case is described in Japanese unexamined Patent Publication (JPP) (Kokai) 11-68319. In the technology recited therein, the decoupling capacitor is incorporated into the multi-layer circuit board made of resin obtained by the built-up process, and the dielectric layer sandwiched between two-layer conductive patterns constituting the capacitor is formed of the material (resin) having the relative dielectric constant of a predetermined value or more. Also, another example is described in JPP (Kokai) 2003-68923. In the technology recited therein, each capacitor portion consists of the wiring layer (one electrode layer) formed on the insulating basic member, the resin layer (dielectric layer) formed on the wiring layer, and the wiring layer (the other electrode layer) formed on the insulating basic member including the resin layer, and then the capacitor obtained by stacking the capacitor portion in a multi-stage manner is incorporated into the semiconductor package.

In the prior art (see JPP 11-68319, JPP 2003-68923) as described above, in order to make the inductance of the decoupling capacitor as small as possible, wiring distances between the capacitor and the semiconductor element to be mounted are reduced as short as possible by incorporating the capacitor into the semiconductor package. In the above prior art, the respective electrodes (conductive patterns, wiring layers) formed on both sides to put the dielectric layer of the capacitor therebetween are connected to a single electrode terminal (external connection terminal). Therefore, when the signal voltage is applied across the electrode terminals, the electric field is generated in one direction between the electrodes according to the polarity of the signal voltage and thus the inductance generated by the current along the direction of the electric field exhibits a certain constant value. In other words, the inductance of the decoupling capacitor has been fixed in dependence on the magnitude of the signal voltage applied across the electrode terminals connected to the respective electrodes of the capacitor on a one-to-one correspondence.

In the state of the art, semiconductor elements, electronic parts, or the like, that are mounted on the package, operate with a high frequency of GHz or more. Thus, the stable operation in the high frequency range of the GHz band is also required of a capacitor used as a decoupling element.

However, in the above prior art, the respective electrodes of the capacitor are connected to the external connection terminals (electrode terminals) on a one-to-one correspondence. Therefore, the problem has arisen in that there is a limit to the reduction of the inductance due to the configurative restriction, and thus the above technology cannot always satisfactorily meet the above demand.

SUMMARY OF THE INVENTION

An object of the present invention is to provide a capacitor structure which can effectively achieve a decoupling effect by reducing its inductance and thus contribute to a stable operation in a high-frequency (GHz band) range, and a multi-layer wiring board and a semiconductor device containing the capacitor structure therein.

In order to attain the above object, according to one aspect of the present invention, there is provided a capacitor structure including a first sheet-like electrode provided on an insulating basic member; a sheet-like dielectric member provided on the first electrode and having a plurality of opening portions formed at required positions, a conductive layer being formed at least on an inner wall portion of each of the opening portions; a second sheet-like electrode provided on the dielectric member and containing a plurality of land portions which are formed to be isolated from peripheral areas at required positions; and a plurality of electrode terminals aligned in a grid on the second electrode and to which opposite polarities are alternately allocated; wherein, among the plurality of electrode terminals, respective electrode terminals to which one polarity is allocated are electrically connected to the second electrode, respective electrode terminals to which the other polarity is allocated are electrically connected to the corresponding land portions, and each of the land portions is electrically connected to the first electrode via the conductive layer in each of the opening portions in the dielectric member.

According to the structure of the capacitor according to this aspect, the opposite polarities (+,−) are alternately allocated to a plurality of electrode terminals, and the electrode terminals to which one polarity (e.g., +) is allocated are connected to one electrode (second electrode) of the capacitor, while the electrode terminals to which the other polarity (e.g., −) is allocated are connected to the other electrode (first electrode). Therefore, when the signal voltage is applied across the neighboring (+)(−) electrode terminals, the electric fields generated between the first and second electrodes are directed in the same direction according to the polarity of the signal voltage. However, when two sets of neighboring (+)(−) electrode terminals are particularly observed, the inductance generated by the current along the electric field between one set of electrode terminals and the inductance generated by the current along the electric field between another set of electrode terminals are canceled out each other, and thus the inductance of the entire capacitor can be relatively reduced. As a result, the decoupling effect of the capacitor can be effectively achieved and the capacitor can also contribute to the stable operation in the high-frequency (GHz band) range.

Also, according to another aspect of the present invention, there is provided a capacitor structure including a first sheet-like electrode provided on an insulating basic member and divided into a plurality of partial electrodes to which opposite polarities are alternately allocated; a sheet-like dielectric member provided on the first electrode and having a plurality of opening portions formed at required positions, a conductive layer being formed at least on an inner wall portion of each of the opening portions; a second sheet-like electrode provided on the dielectric member, divided into a plurality of partial electrodes to which opposite polarities are alternately allocated, and containing a plurality of land portions which are formed to be isolated from peripheral areas at required positions; and a plurality of electrode terminals aligned in a grid on the second electrode and to which opposite polarities are alternately allocated; wherein for each of the respective divided partial electrodes of the first and second electrodes, among the plurality of electrode terminals, respective electrode terminals to which one polarity is allocated are electrically connected to the second electrode, respective electrode terminals to which the other polarity is allocated are electrically connected to the corresponding land portions, and each of the land portions is electrically connected to the first electrode via the conductive layer in each of the opening portions in the dielectric member.

According to the structure of the capacitor according to this aspect, the first and second electrodes to put the dielectric member of the capacitor therebetween are divided into a plurality of partial electrodes such that the opposite polarities (+,−) are alternately allocated. Then, in compliance with these divided partial electrodes, the electrode terminals to which one polarity is allocated are electrically connected to one electrode (second electrode) of the partial capacitor, and the electrode terminals to which the other polarity is allocated are electrically connected to the other electrode (first electrode) of the partial capacitor. Therefore, when the signal voltage is applied across the neighboring (+)(−) electrode terminals, the electric fields generated between the first and second electrodes are directed in the opposite direction according to the polarity of the signal voltage for each of the divided partial electrodes. In this case, when the electrode terminals between the neighboring partial electrodes are particularly observed, the inductance generated by the current along the electric field corresponding to one partial electrode and the inductance generated by the current along the electric field corresponding to the other partial electrode are canceled out each other, and thus the inductance can be further reduced, compared with the capacitor according to the above aspect. As a result, the decoupling effect of the capacitor can be more effectively achieved and the capacitor can also contribute largely to the stable operation in the high-frequency (GHz band) range.

Also, according to still another aspect of the present invention, there is provided a multi-layer wiring board including the capacitor structure according to the above aspect, wherein the capacitor structure is provided directly under a semiconductor element mounting area.

According to the structure of the multi-layer wiring board according to this aspect, when the semiconductor element is mounted on the semiconductor element mounting area, wiring distances between (the electrode terminals of) the capacitor provided directly under the semiconductor element mounting area and the semiconductor element can be reduced to the shortest. Therefore, the inductance of the entire package (the multi-layer wiring board) when viewed from the semiconductor element can be reduced.

Further, according to still another aspect of the present invention, there is provided a semiconductor device including the multi-layer wiring board according to the above aspect, wherein a semiconductor element is mounted on one surface of the multi-layer wiring board to be electrically connected to the plurality of electrode terminals of the capacitor structure.

DESCRIPTION OF THE PREFERRED EMBODIMENTS

Embodiments of the present invention will be hereinafter explained with reference to the accompanying drawings.

Figure 1:
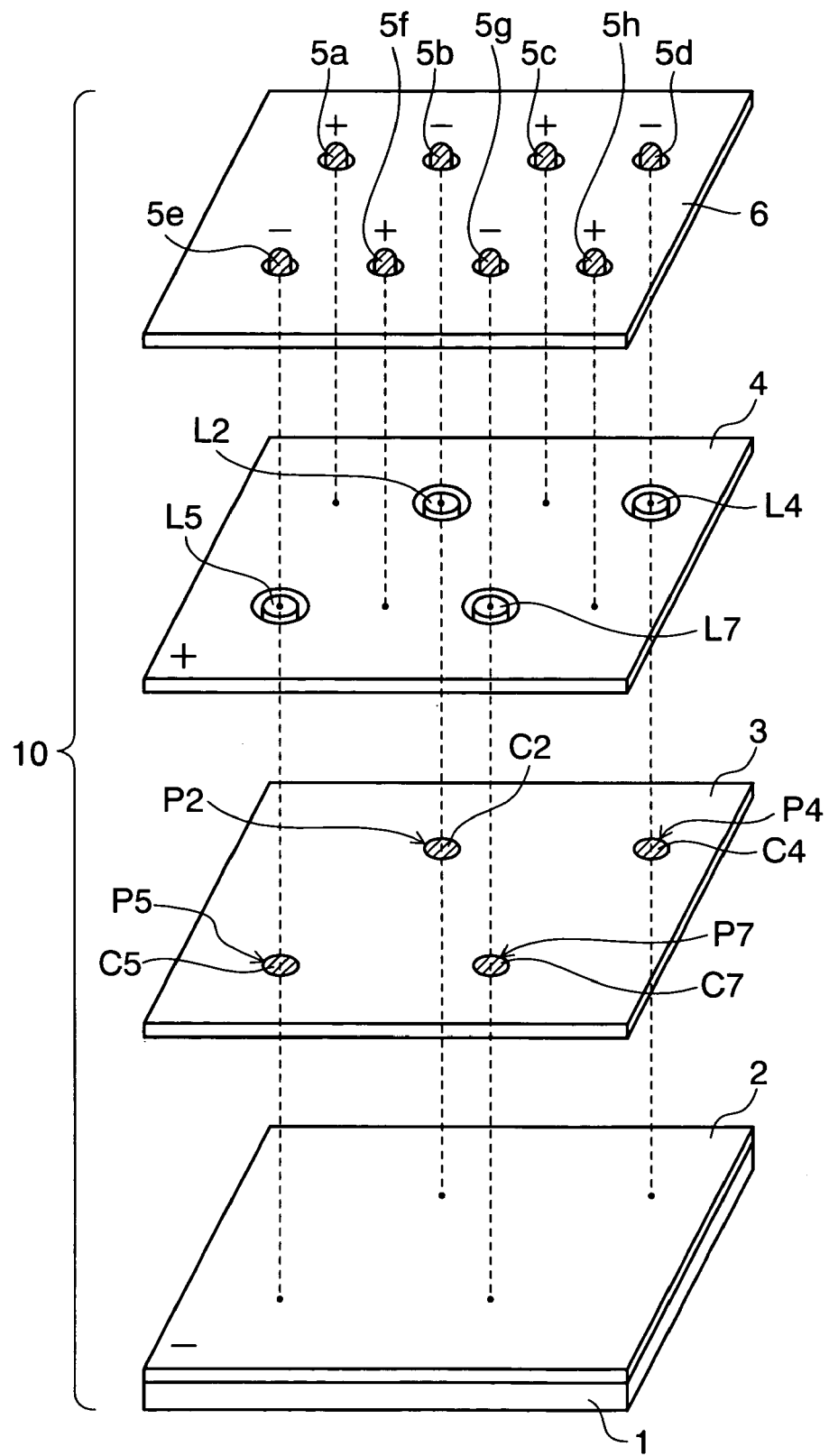
FIG. 1 is an exploded perspective view schematically showing a structure of a capacitor according to a first embodiment of the present invention.

FIG. 1 is an exploded perspective view schematically showing a structure of a capacitor according to a first embodiment of the present invention.

In a capacitor 10 shown in FIG. 1, reference 1 denotes an insulating basic member as a base member of the capacitor 10; reference 2 denotes a conductive layer constituting one electrode of the capacitor 10; reference 3 denotes a resin layer constituting a dielectric member of the capacitor 10; reference 4 denotes a conductive layer constituting the other electrode of the capacitor 10; references 5a to 5h denote electrode terminals aligned in a predetermined sequence; and reference 6 denotes a solder resist layer serving as a protection film of the capacitor 10. The resin layer (dielectric member) 3 is provided onto the conductive layer (electrode) 2. Opening portions P2, P4, P5, P7 are formed at required positions (four positions in the illustrated example) of the resin layer (dielectric member) 3, and conductive layers C2, C4, C5, C7 are formed in the respective insides (at least on inner wall portions) of the opening portions. The conductive layer (electrode) 4 is provided on the resin layer (dielectric member) 3. Land portions L2, L4, L5, L7 are formed at required positions of the conductive layer (electrode) 4 (i.e., positions corresponding to the portions of the resin layer (dielectric member) 3, in which the opening portions P2, P4, P5, P7 are formed) to be isolated from their peripheral areas.

Eight electrode terminals 5a to 5h are aligned on the conductive layer (electrode) 4 in a grid such that opposite polarities (+,−) are alternately allocated to the neighboring electrode terminals (e.g., 5a and 5b, 5a and 5e, 5b and 5f). Also, the protection film 6 is provided onto the conductive layer (electrode) 4 to expose the respective electrode terminals 5a to 5h. Among the electrode terminals 5a to 5h exposed from the protection film 6, the electrode terminals 5a, 5c, 5f, 5h to which one polarity (+) is allocated are electrically connected to the conductive layer (electrode) 4, while the electrode terminals 5b, 5d, 5e, 5g to which the other polarity (−) is allocated are electrically connected to the corresponding land portions L2, L4, L5, L7. Also, the respective land portions are electrically connected to the conductive layer (electrode) 2 via the conductive layers C2, C4, C5, C7 in the opening portions of the resin layer (dielectric member) 3.

As the insulating basic member 1, the sheet-like member formed of woven glass fabric impregnated with an insulating resin such as epoxy resin, polyimide resin, BT resin, or the like, is employed. Also, copper (Cu) is used as the material of the conductive layers (electrodes) 2, 4, and an organic resin such as polyimide resin or the like, into which a high-dielectric inorganic filler is mixed, is used as the material of the resin layer (dielectric member) 3. As the high-dielectric inorganic filler (dielectric member), for example, ceramic powder having a particle size of 5 μm or less is employed. Preferably, the ceramic powder having the perovskite-type structure ($BaTiO_3$, PZT, $SrTiO_3$, or the like) is employed.

The capacitor 10 according to the present embodiment can be manufactured using the well-known technology such as a built-up process. In this case, via holes (opening portions P2, P4, P5, P7) reaching the underlying conductive layer (electrode) 2 are formed in the required positions of the resin layer (dielectric member) 3, for example, by the drilling process using a laser, and the conductive layers C2, C4, C5, C7 are formed in the opening portions by Cu electroless plating and Cu electroplating. Also, the required positions of the conductive layer (electrode) 4 (positions corresponding to the portions of the resin layer (dielectric member) 3, in which the opening portions P2, P4, P5, P7 are formed) are etched in the form of a ring. Thus, the land portions L2, L4, L5, L7 that are isolated from their peripheral areas respectively are formed in the conductive layer (electrode) 4.

According to the structure of the capacitor 10 according to the first embodiment, the opposite polarities are alternately allocated to the respective electrode terminals 5a to 5h aligned in a grid, and the electrode terminals 5a, 5c, 5f, 5h to which one polarity (+) is allocated are connected to one electrode (conductive layer 4) of the capacitor 10, while the electrode terminals 5b, 5d, 5e, 5g to which the other polarity (−) is allocated are connected to the other electrode (conductive layer 2) of the capacitor 10 via the land portions L2, L4, L5, L7 and the conductive layers C2, C4, C5, C7. Therefore, when a signal voltage of a predetermined amplitude is applied across the neighboring electrode terminals with different polarities, the electric fields generated between the upper and lower electrodes 4, 2 according to the polarity of the signal voltage are directed in the same direction. However, when two sets of neighboring electrode terminals with different polarities (e.g., 5a, 5b and 5e, 5f) are particularly observed, the inductance generated by the current along the electric field between one set of electrode terminals (5a, 5b) and the inductance generated by the current along the electric field between another set of electrode terminals (5e, 5f) are canceled out each other, and thus the inductance of the capacitor 10 can be relatively reduced as a whole. As a result, the decoupling effect of the capacitor 10 can be effectively achieved and the capacitor 10 can also contribute to the stable operation in the high-frequency (GHz band) range.

Figure 2:
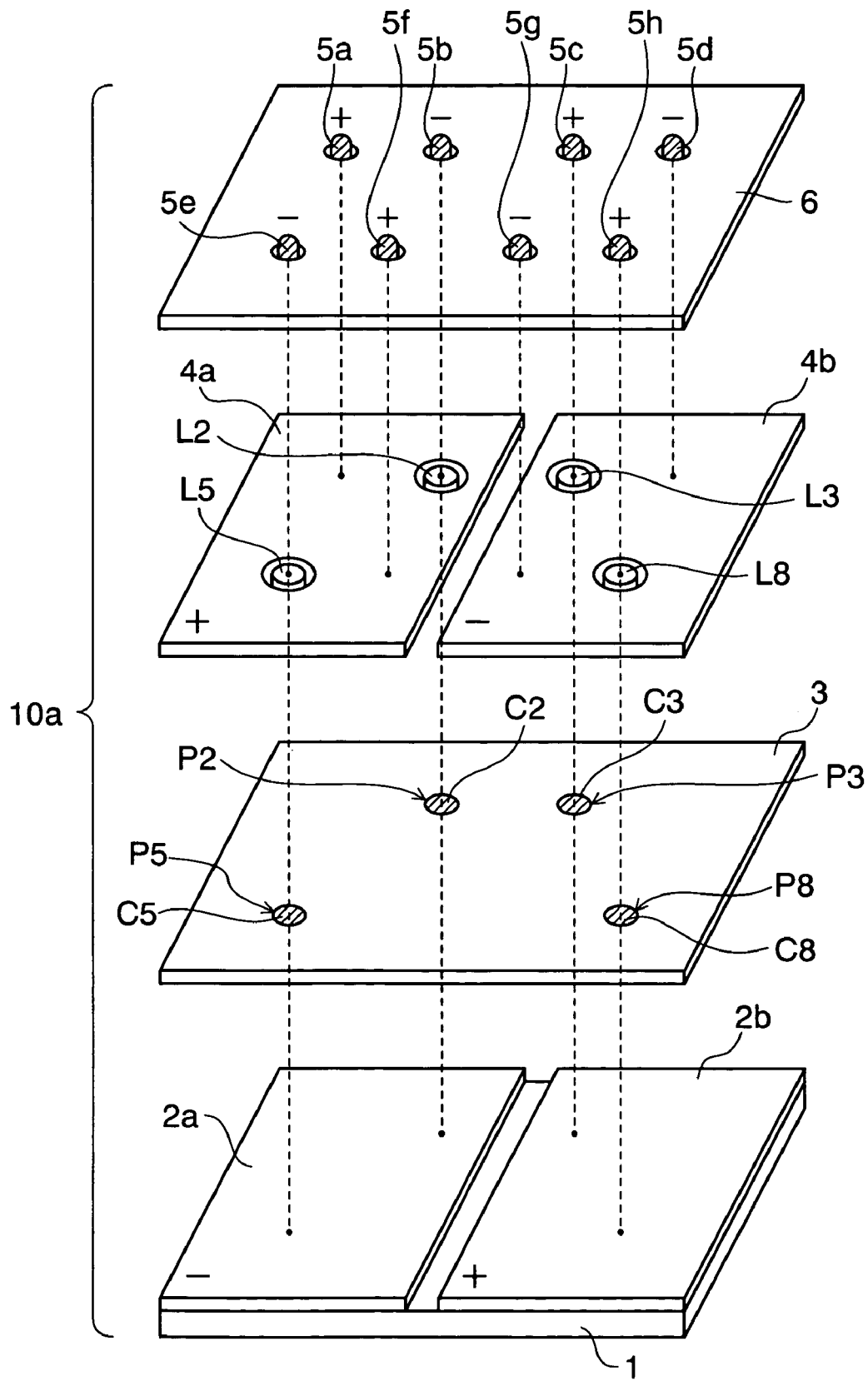
FIG. 2 is an exploded perspective view schematically showing a structure of a capacitor according to a second embodiment of the present invention.

FIG. 2 is an exploded perspective view schematically showing a structure of a capacitor according to a second embodiment of the present invention.

A capacitor 10a shown in FIG. 2 is different from the capacitor 10 shown in FIG. 1 in that lower and upper electrodes arranged on both sides (vertically) to put the dielectric member 3 therebetween are divided into two partial electrodes 2a, 2b and 4a, 4b having the same area such that the opposite polarities (+,−) are alternately allocated to the respective divided partial electrodes. Since the other structure is basically the same as that of the capacitor 10 shown in FIG. 1, its explanation will be omitted.

In the capacitor 10a according to the second embodiment, the electrode terminals 5a (+), 5f (+) and 5d (−), 5g (−) to which one polarity is allocated are electrically connected to the conductive layers (partial electrodes) 4a and 4b, respectively, for each of the partial electrodes 2a, 4a and 2b, 4b that are vertically arranged to put the dielectric member 3 therebetween, and the electrode terminals 5b (−), 5e (−) and 5c (+), 5h (+) to which the other polarity is allocated are electrically connected to the corresponding land portions L2, L5 and L3, L8. Moreover, respective land portions are electrically connected to the conductive layers (partial electrodes) 2a and 2b via the conductive layers C2, C5 and C3, C8 in the opening portions in the resin layer (dielectric member) 3.

According to the structure of the capacitor 10a of the second embodiment, the respective electrodes 2 and 4 to put the dielectric member 3 therebetween are divided into two partial electrodes 2a, 4a and 2b, 4b such that opposite polarities (+,−) are alternately allocated. Also, in compliance with each of the divided partial electrodes, the electrode terminals 5a, 5f and 5d, 5g to which one polarity is allocated are electrically connected to one partial electrode (conductive layers 4a and 4b) of the partial capacitor, while the electrode terminals 5b, 5e and 5c, 5h to which the other polarity is allocated are electrically connected to the other partial electrode (conductive layers 2a and 2b) of the partial capacitor via the corresponding land portions L2, L5 and L3, L8 and the conductive layers C2, C5 and C3, C8. Therefore, when a signal voltage of a predetermined amplitude is applied across the neighboring electrode terminals with different polarities, the electric fields generated between the upper and lower electrodes are directed in the opposite direction according to the polarity of the signal voltage, for each of the divided partial electrodes 2a, 4a and 2b, 4b. In this case, when the electrode terminals between the neighboring partial electrodes (e.g., 4a and 4b) having different polarities are particularly observed, the inductance generated by the current along the electric field corresponding to one partial electrode and the inductance generated by the current along the electric field corresponding to the other partial electrode are canceled out each other, and thus the inductance can be further reduced, compared with the capacitor 10 according to the first embodiment. As a result, the decoupling effect by the capacitor 10a can be achieved more effectively and the capacitor 10a can also contribute largely to the stable operation in the high-frequency (GHz band) range.

In the aspect of the above capacitor 10a according to the second embodiment, explanation is made of the case where each electrode of the capacitor is divided into two parts. In this case, it is of course that the manner of dividing is not limited to the two-division manner. An example other than the two-division manner is shown in FIG. 3.

Figure 3:
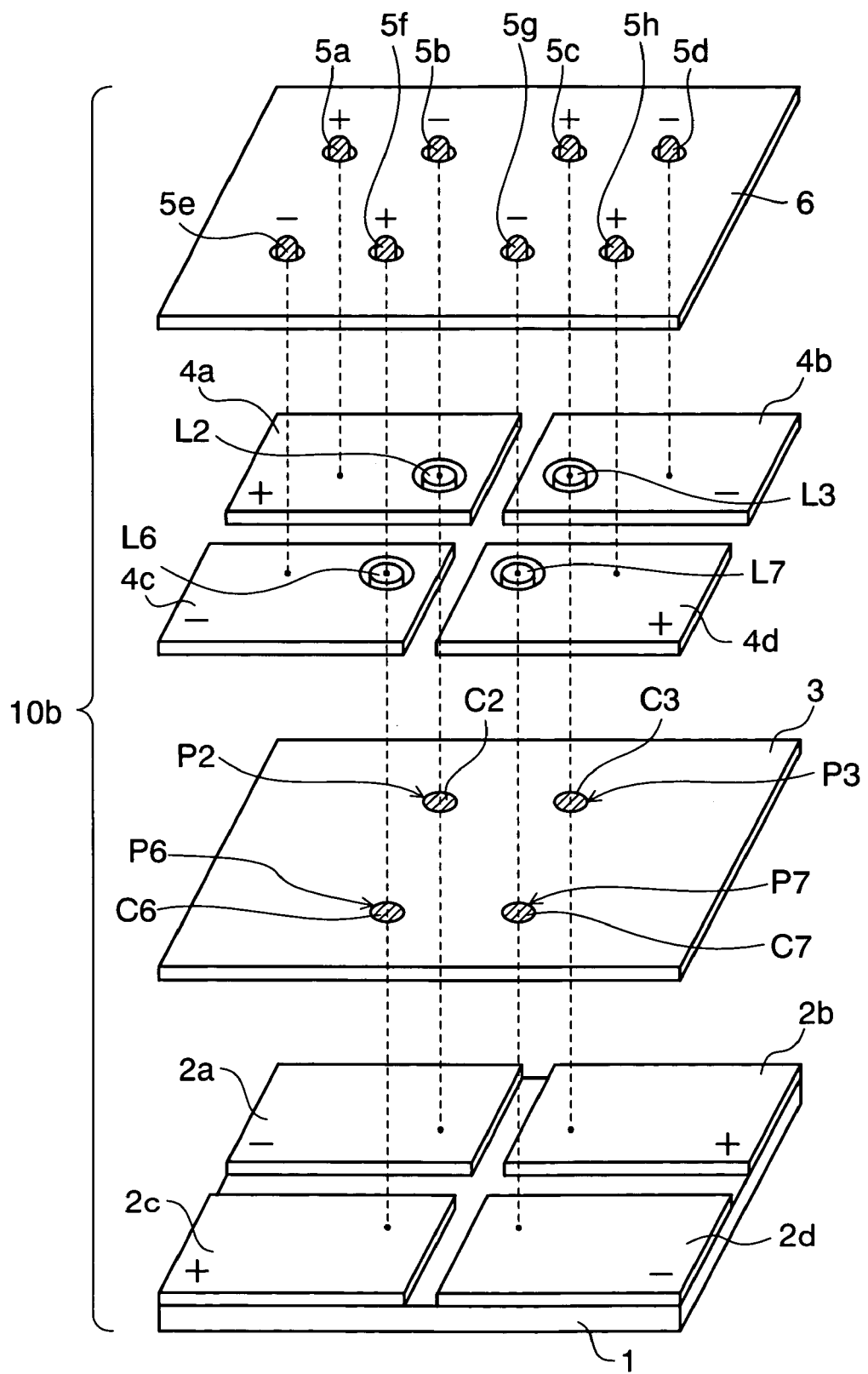
FIG. 3 is an exploded perspective view schematically showing a structure of a capacitor according to a third embodiment of the present invention.

FIG. 3 is an exploded perspective view schematically showing a structure of a capacitor according to a third embodiment of the present invention.

A capacitor 10b shown in FIG. 3 is different from the capacitor 10a shown in FIG. 2 in that lower and upper electrodes vertically arranged to put the dielectric member 3 therebetween are divided into four partial electrodes 2a to 2d and 4a to 4d having the same area. Since the other structure is basically the same as that of the capacitor 10a shown in FIG. 2, their explanation will be omitted.

According to the structure of the capacitor 10b according to the third embodiment, the inductance can be much more reduced, compared with the above capacitor 10a according to the second embodiment. Explanation will be made of this matter with reference to FIG. 4.

Figure 4A:
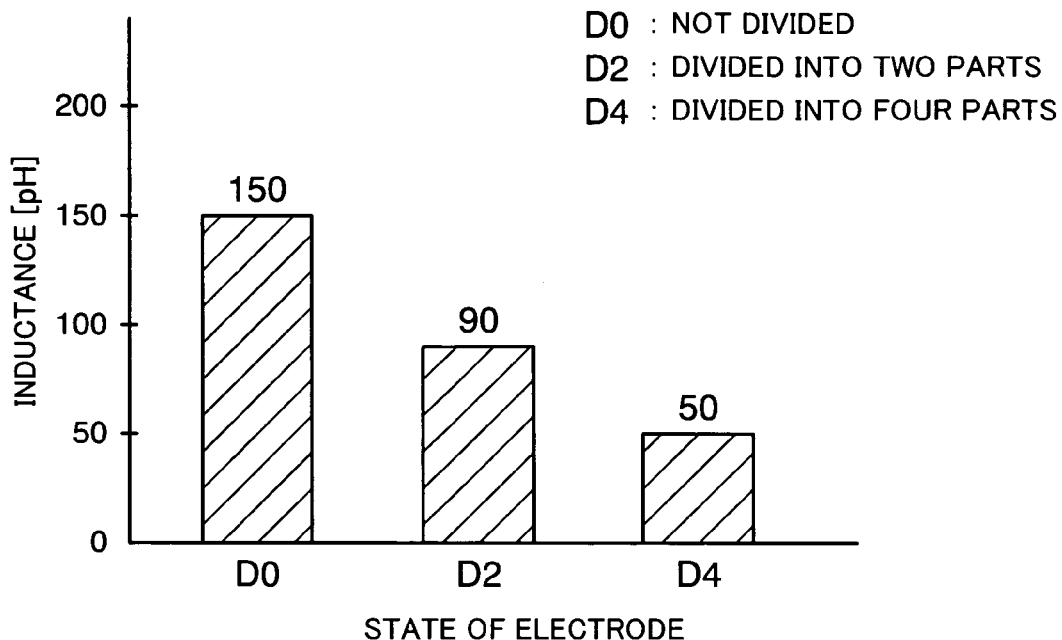
FIGS. 4a and 4b are views for explaining an effect achieved in the case where each electrode of the capacitor is divided.
Figure 4B:
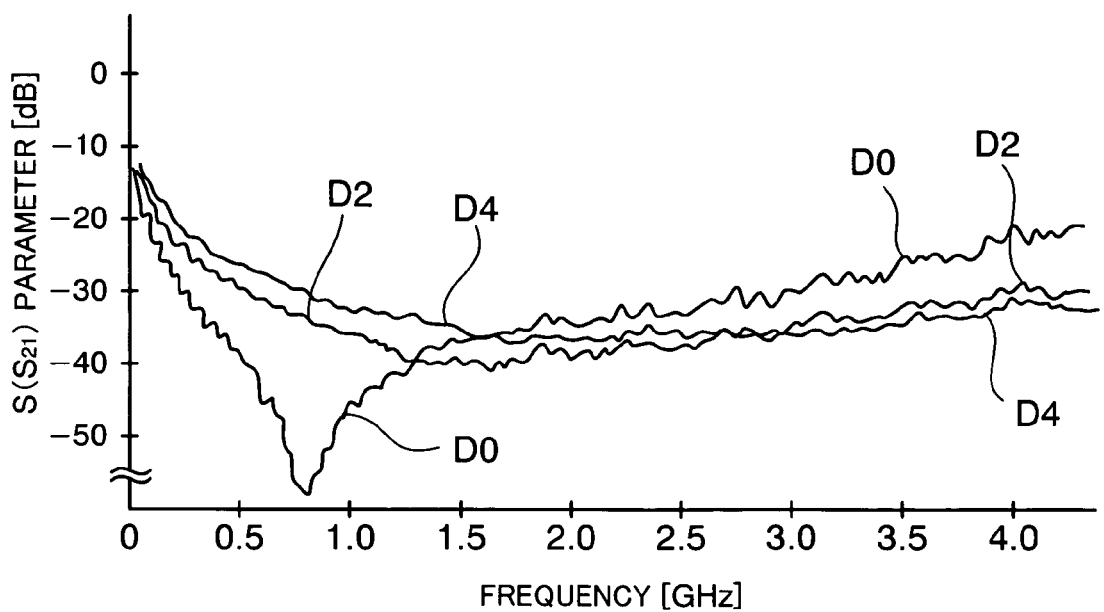

FIGS. 4a and 4b are characteristic views for explaining the effect achieved in the case where each the electrode of the capacitor is divided. In the illustrated example, the inductances (FIG. 4a) derived from the simulation and the behaviors (FIG. 4b) of change in the $S(S_{21})$ parameter (corresponding to change in the "impedance") relative to change in the frequency are shown with respect to the structures of the capacitor 10 (FIG. 1) where each electrode is not divided, the capacitor 10a (FIG. 2) where each electrode is divided into two parts, and the capacitor 10b (FIG. 3) where each electrode is divided into four parts.

Namely, as shown in FIG. 4a, the inductance of the capacitor in the cases (D2, D4) where each electrode is divided can be much more reduced, compared with the case (D0) where each electrode is not divided. Also, even when each electrode is divided, further reduction in the inductance can be achieved with the increase in the number of division (D2→D4).

Also, as shown in FIG. 4b, in the cases (D2, D4) where each electrode is divided, the frequency band in which the operation (i.e., the impedance) is stable can be shifted toward the higher frequency side and thus the capacitor that is excellent in the high frequency characteristics can be accomplished. As a result, the decoupling effect by the capacitor 10b can be attained more effectively and the capacitor 10b can also contribute largely to the stable operation in the high-frequency (GHz band) range.

In the aspects of the capacitors 10a, 10b according to the second and third embodiments, explanation is made as above while taking as an example the case where each electrode of the capacitor is divided (two parts, four parts) to have the same area. It is of course that the electrodes should not always be divided into parts to have the same area, and that the electrodes may be divided into parts to have the different area. An example of the case is shown in FIG. 5.

Figure 5:
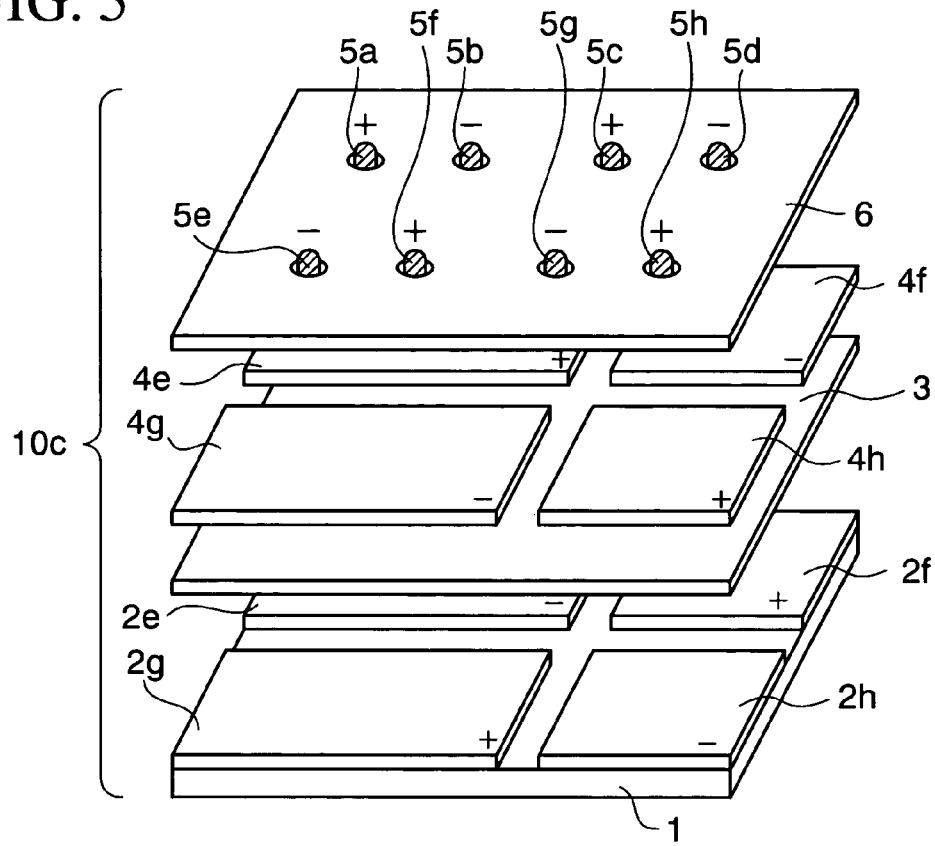
FIG. 5 is an exploded perspective view schematically showing a structure of a capacitor according to a fourth embodiment of the present invention.

FIG. 5 is an exploded perspective view schematically showing a structure of a capacitor according to a fourth embodiment of the present invention.

A capacitor 10c shown in FIG. 5 is different from the capacitor 10b shown in FIG. 3 in that lower and upper electrodes vertically arranged to put the dielectric member 3 therebetween are divided into partial electrodes 2e to 2h and 4e to 4h having the different area. Since the other structure is basically the same as that of the capacitor 10b shown in FIG. 3, its explanation will be omitted. In this case, for the purpose of simplicity of illustration, the land portions to be formed in the upper partial electrodes 4e to 4h, the opening portions and the conductive layers to be formed in the dielectric member 3, are omitted from the illustration.

Figure 6:
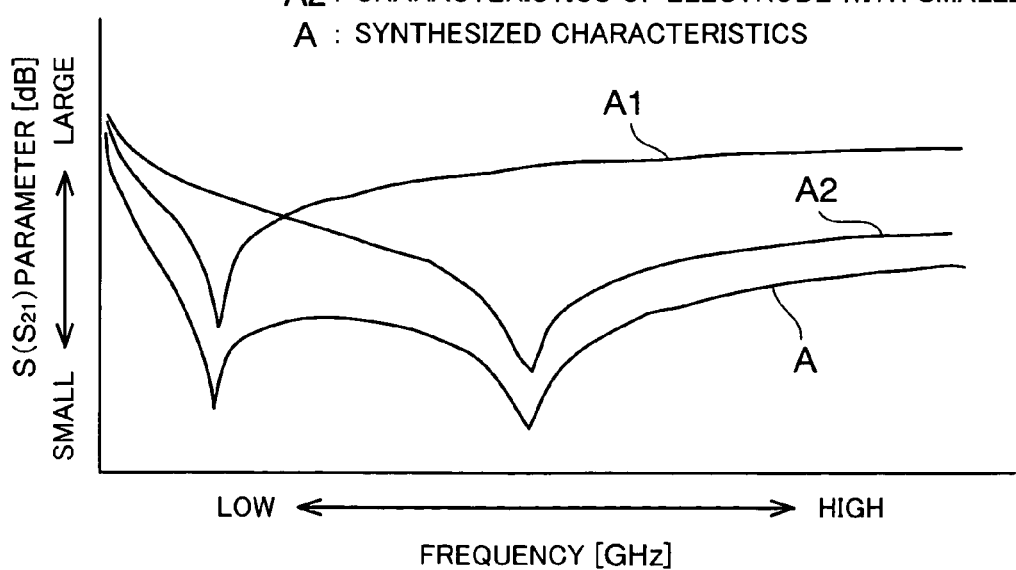
FIG. 6 is a view for explaining an effect achieved in the case where each electrode of the capacitor is divided to have different areas.

FIG. 6 is a characteristic view for explaining the effect achieved in the case where each electrode of the capacitor is divided into parts having different areas (i.e., the effect peculiar to the capacitor 10c according to the fourth embodiment).

FIG. 6 shows behaviors (characteristic curves A1, A2) of change in the $S(S_{21})$ parameter (corresponding to change in the "impedance") relative to change in the frequency derived from the simulation and their qualitative combination (characteristic curve A) in the partial capacitors with larger electrode area (in the example in FIG. 5, the partial electrodes 2e, 4e and 2g, 4g) and the partial capacitors with smaller electrode area (in the example in FIG. 5, the partial electrode 2f, 4f and 2h, 4h).

As shown in FIG. 6, since each electrode of the capacitor is divided into parts having the different area, the number of resonance points becomes plural (two in the example of the characteristic curve A) and thus the "decoupling" capacitor 10c exhibiting the low impedance characteristics in the relatively wide frequency range can be realized.

In the above embodiments, explanation is made of the case where each capacitor 10 (10a, 10b, 10c) is constituted as the three-layer structure consisting of the dielectric member 3 and two electrodes 2 and 4 (2a, 2b and 4a, 4b, 2a to 2d and 4a to 4d, 2e to 2h and 4e to 4h) to put the dielectric member 3 therebetween. However it is a matter of course that the form of the capacitor is not limited to the above embodiments, and a multi-layer structure in which the dielectric member and the electrode are alternately stacked by the predetermined number of layers may be employed. An example of the case is shown in FIG. 7.

Figure 7:
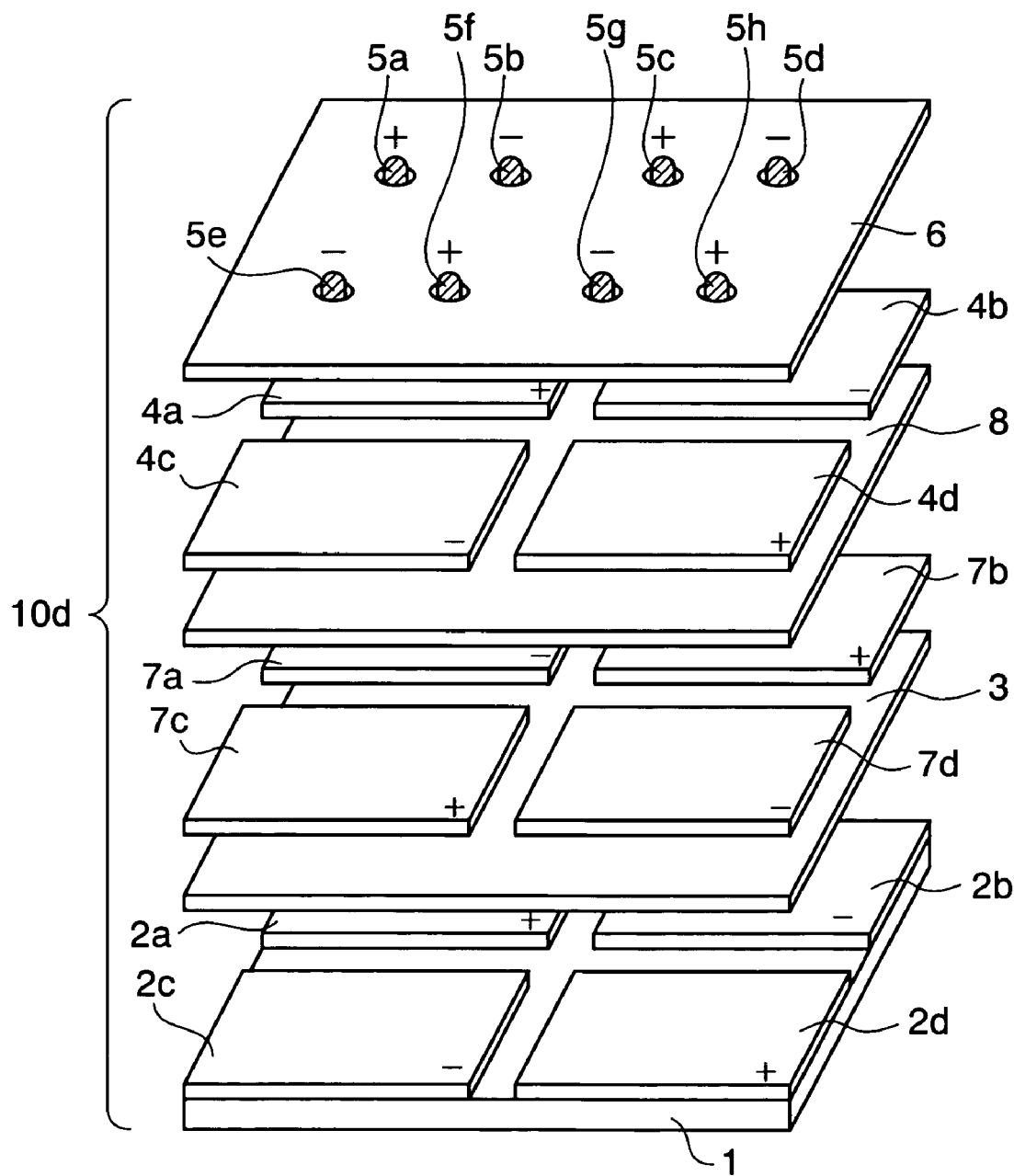
FIG. 7 is an exploded perspective view schematically showing a structure of a capacitor according to a fifth embodiment of the present invention.

FIG. 7 is an exploded perspective view schematically showing a structure of a capacitor according to a fifth embodiment of the present invention.

A capacitor 10d shown in FIG. 7 is different from the capacitor 10b shown in FIG. 3 in that additional electrodes (partial electrodes 7a to 7d) having the same structure as the electrodes (partial electrodes 4e to 4d) (but having the opposite polarity) and an additional dielectric member 8 having the same structure as the dielectric member 3 are provided between the dielectric member 3 and the overlying electrodes (partial electrodes 4e to 4d). Since the other structure is basically the same as that of the capacitor 10b shown in FIG. 3, its explanation will be omitted. Similarly, for the purpose of simplicity of illustration, the land portions to be formed in the upper electrodes (partial electrodes 4a to 4d, 7a to 7d), the opening portions and the conductive layers to be formed in the dielectric members 3, 8, are omitted from the illustration.

Figure 8:
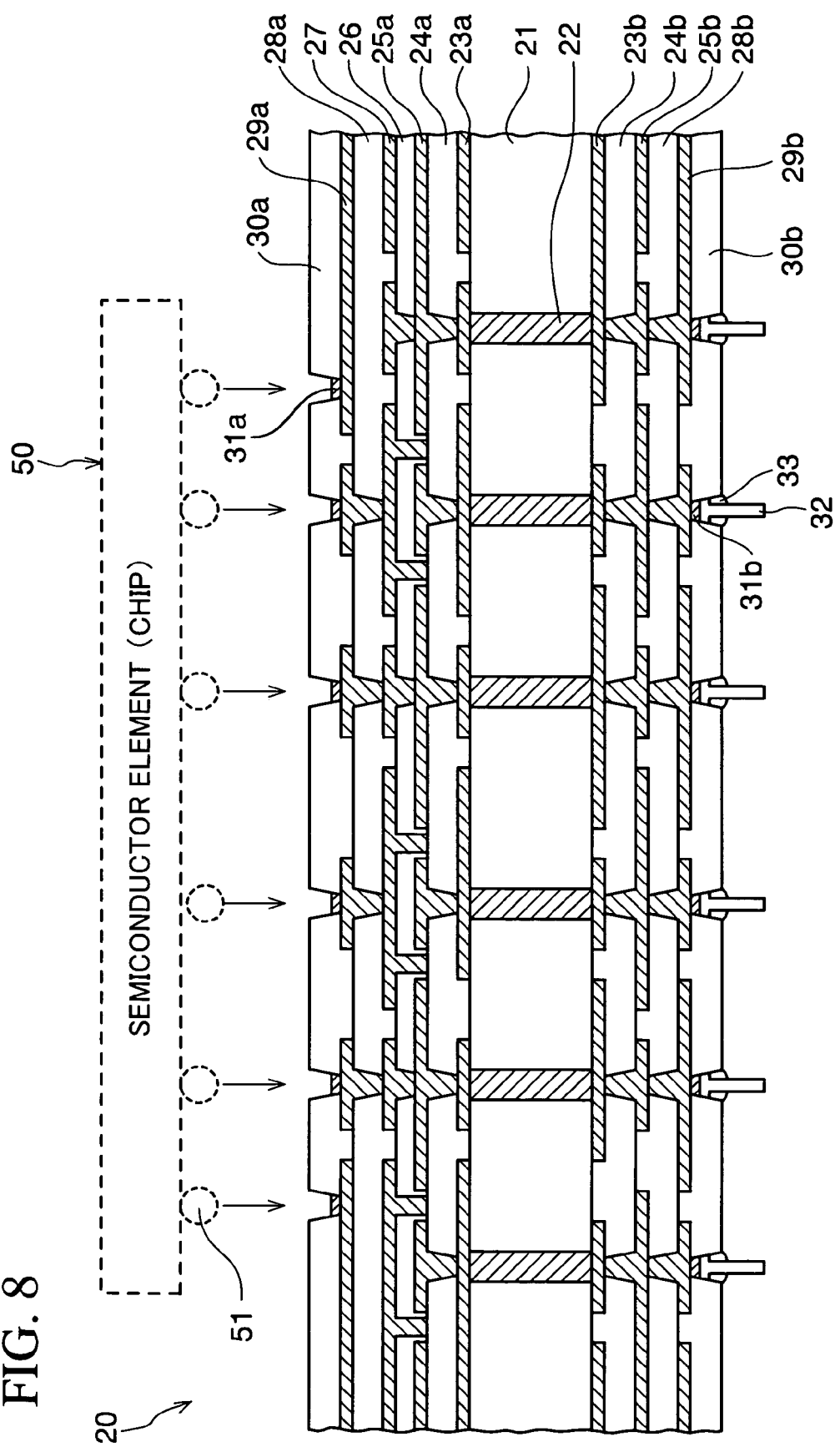
FIG. 8 is a sectional view showing an example of a multi-layer wiring board (semiconductor package) into which the capacitor according to each embodiment of the present invention is packaged.

FIG. 8 is a schematic sectional view showing an example of a multi-layer wiring board (semiconductor package) into which the capacitor according to each embodiment of the present invention is packaged.

In a semiconductor package 20 shown in FIG. 8, reference 21 denotes an insulating basic member as a core member of the package; 22 denotes a conductive member filled in a through hole formed in required positions of the insulating basic member 21; 23a, 23b denotes a wiring layer formed on both surfaces of the insulating basic member 21 by patterning; 24a, 24b denotes a resin layer formed on the insulating basic member 21 and the wiring layers 23a, 23b; 25a, 25b denotes a wiring layer formed on the resin layers 24a, 24b by patterning to be electrically connected to the wiring layers 23a, 23b; 26 denotes a resin layer formed on the wiring layer 25a by patterning; 27 denotes a wiring layer formed on the resin layer 26 by patterning; 28a, 28b denotes a resin layer formed on the wiring layers 27, 25b; 29a, 29b denotes a wiring layer formed on the resin layer 28a, 28b by patterning to be electrically connected to the wiring layers 27, 25b; 30a, 30b denotes a solder resist layer formed on the wiring layer 29a, 29b as a protection layer to have opening portions in predetermined portions; 31a, 31b denotes a nickel (Ni)/gold (Au) plating film formed on the pads (the wiring layers 29a, 29b) exposed from the opening portions of the solder resist layer 30a, 30b; 32 denotes a pin as an external connection terminal used when the present package 20 is mounted on a packaging board such as a mother board or the like; and 33 denotes a solder used to bond the pin 32 to the Ni/Au plating film 31b exposed from the opening portion in the lower solder resist layer 30b on the wiring layer 29b. As the material of the pin 32, for example, Ni/Au-plated Kovar is employed.

In the structure of the present package 20, the resin layer 26 constitutes the dielectric layer of the capacitor that is incorporated into the present package, the wiring layer 25a formed under the resin layer 26 constitutes one electrode layer of the capacitor, and the wiring layer 27 formed on the resin layer 26 constitutes the other electrode layer of the capacitor. For example, supposing the case where the capacitor 10 (FIG. 1) according to the first embodiment is incorporated into the present package 20, the insulating basic member 1, the electrode 2, the dielectric layer 3, the electrode 4, and the solder resist layer 6 as the protection layer in FIG. 1, respectively, correspond to the resin layer 24a, the wiring layer 25a, the resin layer 26, the wiring layer 27, and the resin layer 28a in FIG. 8. Also, the electrode terminals 5a to 5h aligned on the electrode 4 in predetermined sequence correspond to the pads defined by a portion of the wiring layer 29a. In the illustration in FIG. 8, for the purpose of simplification of illustration, the land portions to be formed in the electrode 4 (wiring layer 27), the opening portions and the conductive layers, to be formed in the dielectric layer 3 (resin layer 26), are omitted.

The semiconductor package 20 shown in FIG. 8 can be manufactured using the well-known technology such as a built-up process or the like. The manufacturing method is basically the same as to the method described in the above Patent Literatures (JPP 11-68319, JPP 2003-68923). Therefore, the explanation will be omitted.

A semiconductor element (chip) 50 is mounted on the semiconductor package 20 via electrode terminals 51 (solder bumps, gold (Au) bumps, or the like), as shown by a broken line in FIG. 8. In the case where the semiconductor device is obtained by mounting the semiconductor chip 50 on the present package 20, the chip 50 is mounted in such a manner that the electrode terminals 51 (solder bumps, or the like) of the semiconductor chip 50 are electrically connected to the Ni/Au plating film 31a on the wiring layer 29a exposed from the opening portion of the upper solder resist layer 30a of the package 20. This mounting can be performed by flip-chip bonding. For example, the ACF bonding using an anisotropic conductive film (ACF) can be employed. Also, in the case where the present package 20 is mounted on the packaging board such as a mother board or the like, the electrical connection between them is carried out by putting the paste-like solder on the corresponding conductive portions (pads) of the board in proper quantity and then solidifying the solder by reflow soldering while contacting foot portions of the pins 32 thereto.

According to the structure of the semiconductor package (multi-layer wiring board) 20 shown in FIG. 8, wiring distances to connect the capacitor (the wiring layer 25a as one electrode layer, the resin layer 26 as the dielectric layer, and the wiring layer 27 as the other electrode layer) provided directly under the semiconductor chip 50 when the semiconductor chip 50 is packaged and the semiconductor chip 50 can be reduced to the shortest. Therefore, the inductance of the overall package 20 (i.e., semiconductor device) when viewed from the semiconductor chip 50 can be reduced and the structure of this package can respond to the higher signal speed in excess of GHz or more.

Figure 9:
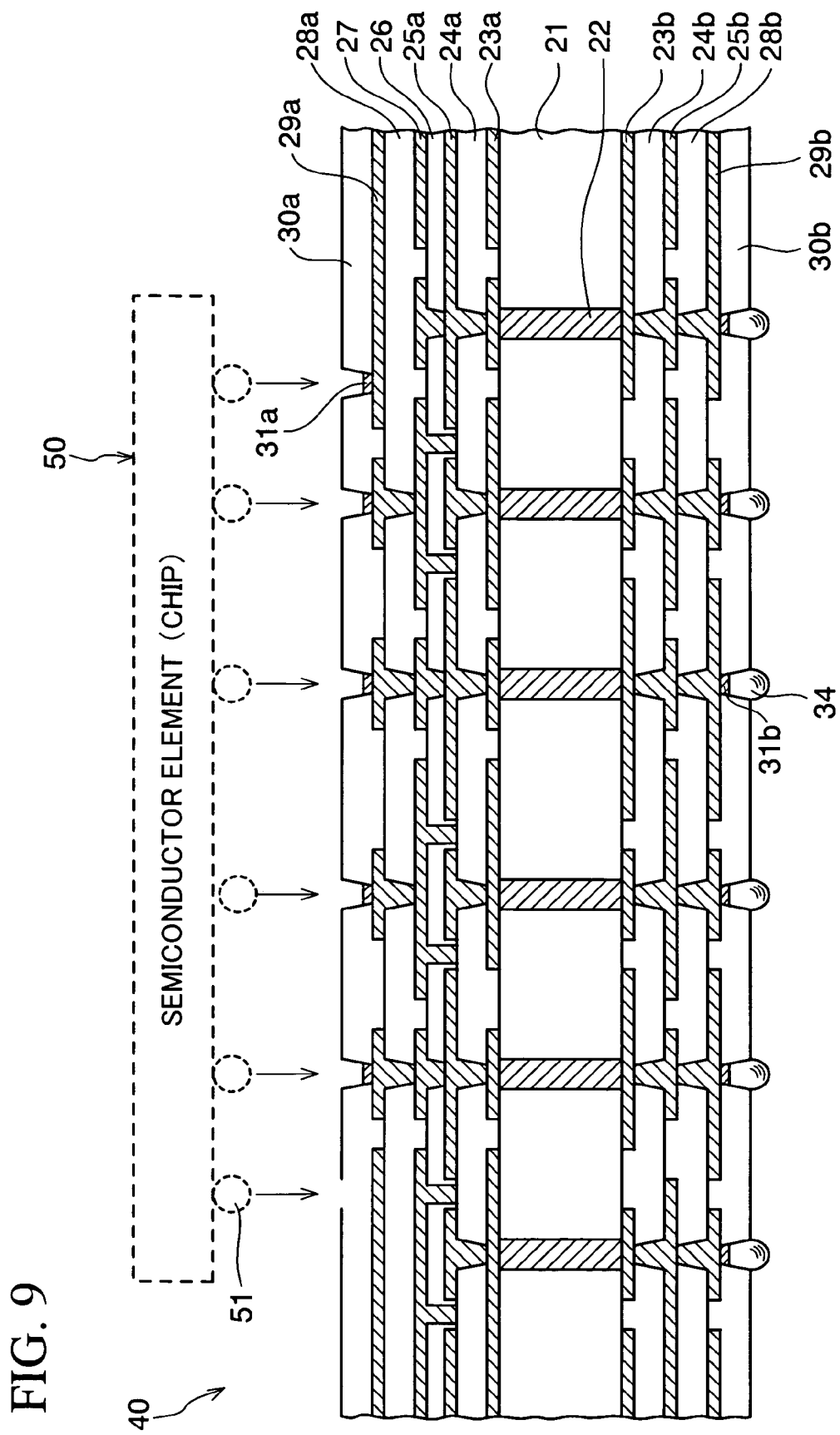
FIG. 9 is a sectional view showing another example of a multi-layer wiring board (semiconductor package) into which the capacitor according to each embodiment of the present invention is packaged.

In the aspect of the semiconductor package 20 shown in FIG. 8, explanation is made while taking as an example the case where the pin 32 is used as the external connection terminal used to package the semiconductor package 20 onto the mother board or the like. However, it is of course that the form of the external connection terminal is not limited to the "pin". For instance, the ball-like form as shown in the ball grid array (BGA), or the like, can be employed. An example of the case is shown in FIG. 9. FIG. 9 is a schematic sectional view showing a structure of a semiconductor package 40 when solder balls 34 are used as the external connection terminals. Since the other structure is basically the same as that of the semiconductor package 20 shown in FIG. 8, its explanation will be omitted.

What is claimed is:

1. A capacitor structure comprising:
a first sheet-like electrode provided on an insulating basic member and divided into a plurality of partial electrodes to which opposite polarities are alternately allocated;
a sheet-like dielectric member provided on the first electrode and having a plurality of opening portions formed at required positions, a conductive layer being formed at least on an inner wall portion of each of the opening portions;

a second sheet-like electrode provided on the dielectric member, divided into a plurality of partial electrodes to which opposite polarities are alternately allocated, and containing a plurality of land portions which are formed to be isolated from peripheral areas at required positions; and a plurality of electrode terminals aligned in a grid on the second electrode and to which opposite polarities are alternately allocated;

wherein for each of the respective divided partial electrodes of the first and second electrodes, among the plurality of electrode terminals, respective electrode terminals to which one polarity is allocated are electrically connected to the second electrode, respective electrode terminals to which the other polarity is allocated are electrically connected to the corresponding land portions, and each of the land portions is electrically connected to the first electrode via the conductive layer in each of the opening portions in the dielectric member.

2. The capacitor structure according to claim 1, wherein each of the respective divided partial electrodes of the first and second electrodes has a different area.

3. The capacitor structure according to claim 1, wherein a third electrode having the same structure as the second electrode and an additional dielectric member having the same structure as the dielectric member are alternately stacked between the dielectric member and the second electrode by a predetermined number of layers such that opposite polarities are alternately allocated to respective electrodes.

4. The capacitor structure according to claim 1, wherein a protection film is provided on the second electrode to expose the plurality of electrode terminals.

5. A multi-layer wiring board comprising the capacitor structure according to claim 1, wherein the capacitor structure is provided directly under a semiconductor element mounting area.

6. A semiconductor device comprising the multi-layer wiring board according to claim 5, wherein a semiconductor element is mounted on one surface of the multi-layer wiring board to be electrically connected to the plurality of electrode terminals of the capacitor structure.

* * * * *